(12) United States Patent
Chang et al.

(10) Patent No.: US 9,490,219 B2
(45) Date of Patent: Nov. 8, 2016

(54) SEMICONDUCTOR PACKAGE WITH SHIELDING MEMBER AND METHOD OF MANUFACTURING THE SAME

(71) Applicant: Siliconware Precision Industries Co., Ltd., Taichung (TW)

(72) Inventors: Cho-Hsin Chang, Taichung (TW);
Tsung-Hsien Hsu, Taichung (TW);
Hsin-Lung Chung, Taichung (TW);
Te-Fang Chu, Taichung (TW);
Chia-Yang Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/459,678

(22) Filed: Aug. 14, 2014

(65) Prior Publication Data

US 2015/0333017 A1 Nov. 19, 2015

(30) Foreign Application Priority Data

May 16, 2014 (TW) .............................. 103117272 A

(51) Int. Cl.
*H01L 23/552* (2006.01)
*H01L 21/56* (2006.01)
*H01L 23/66* (2006.01)
*H01L 23/31* (2006.01)
*H01L 23/00* (2006.01)

(52) U.S. Cl.
CPC ............ *H01L 23/552* (2013.01); *H01L 21/56* (2013.01); *H01L 23/3121* (2013.01); *H01L 23/66* (2013.01); *H01L 24/13* (2013.01); *H01L 24/16* (2013.01); *H01L 24/48* (2013.01); *H01L 24/49* (2013.01); *H01L 2224/131* (2013.01); *H01L 2224/16225* (2013.01); *H01L 2224/48091* (2013.01); *H01L 2224/48227* (2013.01); *H01L 2224/49175* (2013.01); *H01L 2924/1421* (2013.01); *H01L 2924/15313* (2013.01); *H01L 2924/19105* (2013.01); *H01L 2924/3025* (2013.01)

(58) Field of Classification Search
CPC ................... H01L 23/552; H01L 2924/3025
USPC .......................................... 257/659; 438/127
See application file for complete search history.

(56) References Cited

U.S. PATENT DOCUMENTS

| | | | | |
|---|---|---|---|---|
| 2010/0006988 A1* | 1/2010 | Tang | ................... | H01L 21/6835 257/659 |
| 2010/0109132 A1* | 5/2010 | Ko | ........................ | H01L 21/561 257/660 |
| 2010/0110656 A1* | 5/2010 | Ko | ........................ | H01L 21/561 361/818 |
| 2010/0207258 A1* | 8/2010 | Eun | ....................... | H01L 23/055 257/660 |

OTHER PUBLICATIONS

"Communicate" Merriam-Webster Online Dictionary. 2016, http://www.merriam-webster.com/ (Mar. 7, 2016).*

* cited by examiner

*Primary Examiner* — Jami M Valentine
(74) *Attorney, Agent, or Firm* — Mintz Levin Cohn Ferris Glovsky and Popeo, P.C.; Peter F. Corless; Steven M. Jensen

(57) ABSTRACT

This invention provides a semiconductor package, including a substrate, a plurality of semiconductor elements disposed on the substrate, at least one shielding member disposed between at least two of the semiconductor elements, and an encapsulant encapsulating the semiconductor elements and shielding members. Through the shielding member, electromagnetic interference caused among semiconductor elements can be prevented.

16 Claims, 3 Drawing Sheets

# SEMICONDUCTOR PACKAGE WITH SHIELDING MEMBER AND METHOD OF MANUFACTURING THE SAME

CROSS-REFERENCES TO RELATED APPLICATIONS

This application claims under 35 U.S.C. §119(a) the benefit of Taiwanese Application No. 103117272, filed May 16, 2014, the entire contents of which is incorporated herein by reference.

BACKGROUND OF THE INVENTION

1. Field of the Invention

The present invention relates to semiconductor packages, and, more particularly, to a semiconductor package and a method of manufacturing the same that will not be electromagnetically interfered by electronic elements in the semiconductor package.

2. Description of Related Art

With rapid advancement in the technology of electronic industry, semiconductor products have been developed in various types, in view of improving electrical performance. Hence several semiconductor types are incorporated with shielding effect to prevent electromagnetic interference (EMI).

A radio frequency (RF) module 1 prevents EMI. As shown in FIGS. 1A-1C, the radio frequency module 1 is formed by electrically connecting a plurality of radio frequency chips 11a, 11b and non-radio frequency electronic elements 11 onto a substrate 10, encapsulating the radio frequency chips 11a, 11b and the non-radio frequency electronic elements 11 by an encapsulant 13 such as epoxy resin, and forming a metal thin film 14 on the encapsulant 13. The radio frequency module 1 protects the radio frequency chips 11a, 11b, non-radio frequency electronic elements 11 and the substrate 10 from damages and contaminations from external moist or substances. Through the metal thin film 14, the radio frequency chips 11a, 11b can be protected from external EMI.

However, although the outer portion of the conventional radio frequency module 1 can be protected through the metal thin film 14, it is not possible to eliminate electromagnetic interference caused among the radio frequency chips 11a, 11b, such that signal errors still exist.

Therefore, there is an urgent need to provide a semiconductor package wherein electromagnetic interference among the electronic elements formed in the radio frequency module can be eliminated.

SUMMARY OF THE INVENTION

In view of the foregoing problems, the present invention provides a semiconductor package, comprising: a substrate; a plurality of semiconductor elements disposed on the substrate; at least a shielding member disposed on the substrate and between at least two of the semiconductor elements; and an encapsulant formed on the substrate and encapsulating the semiconductor elements and the at least a shielding member.

The present invention further provides a method of manufacturing a semiconductor package, comprising: disposing on a substrate a plurality of semiconductor elements and at least a shielding member, allowing the at least a shielding member to be disposed between at least two of the semiconductor elements; and forming on the substrate an encapsulant that encapsulate the semiconductor elements and the shielding member.

In an embodiment, at least one of the semiconductor elements is a radio frequency chip, such as a Bluetooth chip and a Wi-Fi chip.

In an embodiment, the shielding member is exposed from the encapsulant and has a surface exposed from the encapsulant that is flush with a surface of the encapsulant.

In an embodiment, the shielding member is a board.

In an embodiment, a metal layer is further formed on the encapsulant, electrically connected with the shielding member, and made of copper, nickel, iron, aluminum, or stainless steel. The substrate has a circuit that is electrically connected with the metal layer.

In summary, in the semiconductor package and a method of manufacturing the same, the shielding member is disposed between at least two of the semiconductor elements, so as to prevent electromagnetic interference from occurrence between the at least two of the semiconductor elements.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "top", "one", "bottom", etc., are merely for illustrative purpose and should not be construed to limit the scope of the present invention.

Figure 1A:
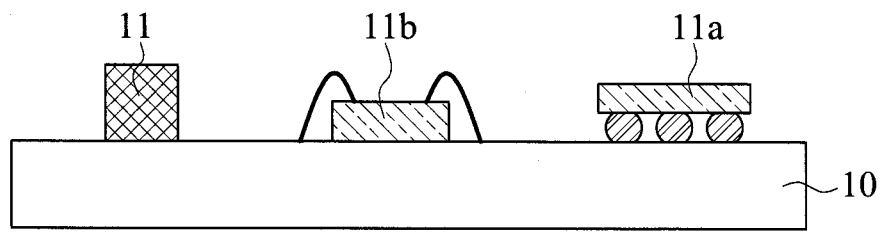
FIGS. 1A-1C are cross-sectional views illustrating a method of manufacturing a conventional radio frequency module.
Figure 1B:
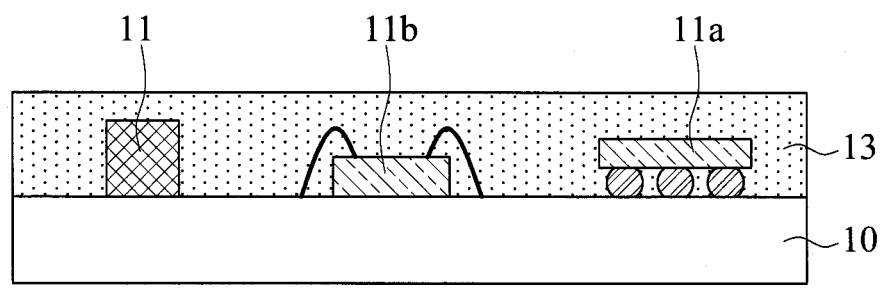
Figure 1C:
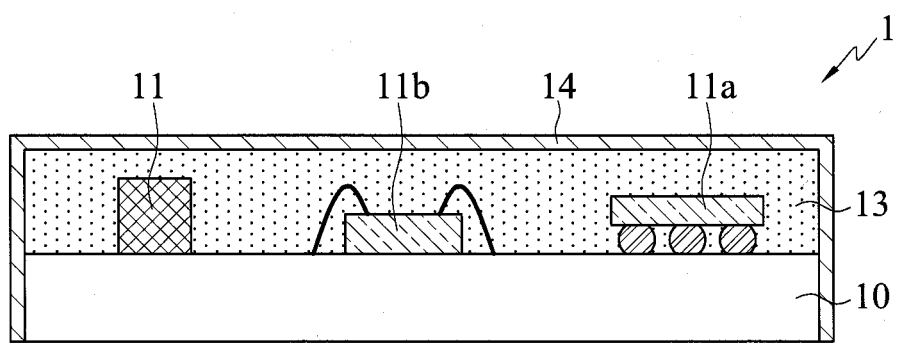
Figure 2A:
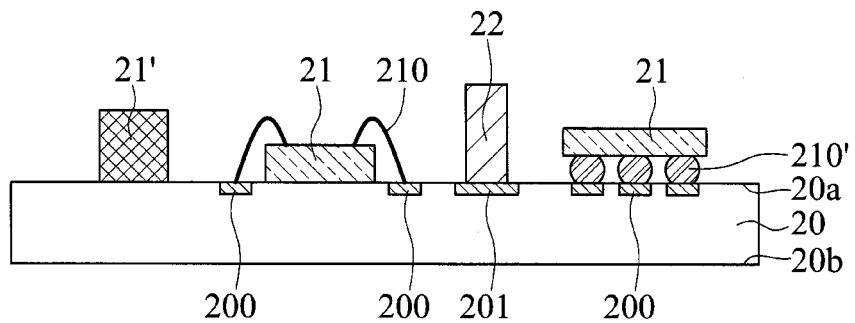
FIGS. 2A-2C are cross-sectional schematic views illustrating a method of manufacturing a semiconductor package according to the present invention; wherein FIG. 2A' is the 3D view of FIG. 2A, and FIG. 2c' is the other embodiment of FIG. 2C.
Figure 2A:
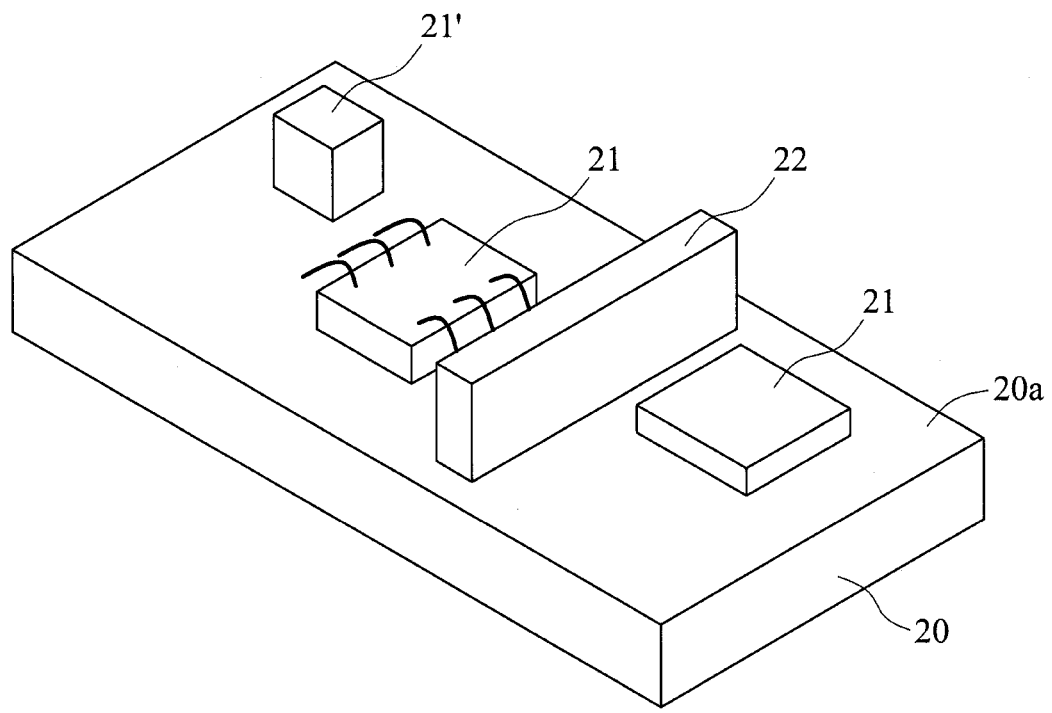
Figure 2B:
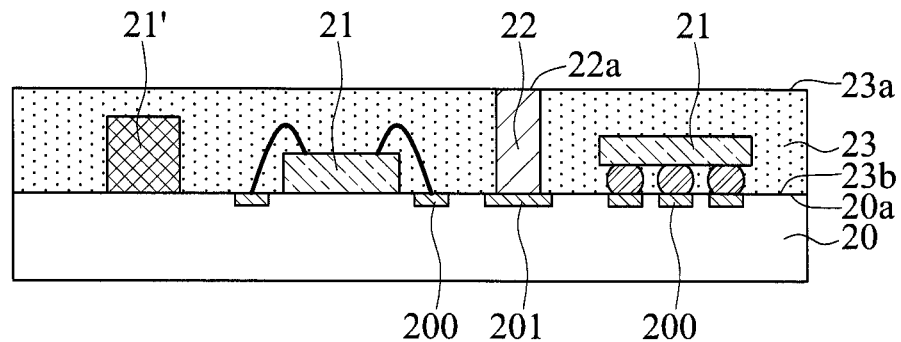
Figure 2C:
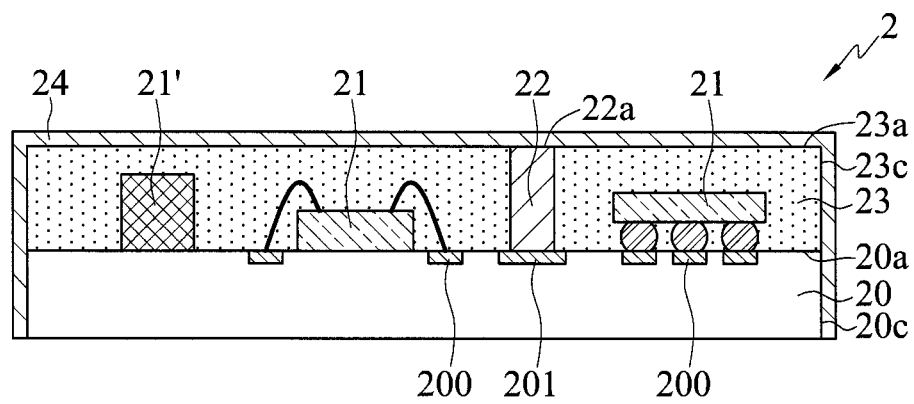
Figure 2C:
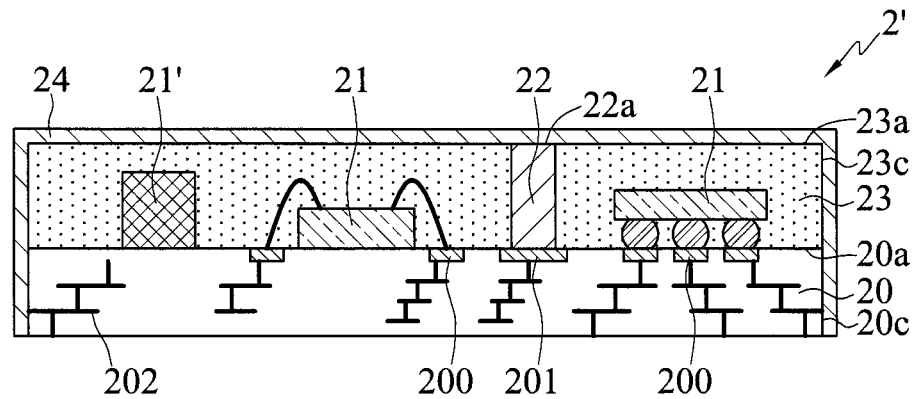

Referring to FIGS. 2A to 2C, a method of manufacturing a semiconductor package 2 is provided. In an embodiment, the semiconductor package 2 is an electromagnetic wave generator such as a radio frequency (RF) module.

As illustrated in FIGS. 2A and 2A', a substrate 20 having a top surface 20a and a bottom surface 20b is provided, and a plurality of semiconductor elements 21 and at least one shielding member 22 are disposed on the top surface 20a of the substrate 20. And, the shielding member 22 is disposed between at least two of the semiconductor elements 21.

A circuit layer is formed on the top surface 20a of the substrate 20, and comprises a plurality of electrical contact pads 200 and at least one grounding part 201. In an embodiment, varieties of substrate 20 are provided, and the circuit layer of the substrate 20 has at least one inner circuit 202 (as shown in FIG. 2C'), which can be electrically connected with the electrical contact pads 200 and the grounding part 201 selectively. There is no specific limitation for the structure of the substrate 20.

In an embodiment, the semiconductor element 21 is a radio frequency chip, such as a Bluetooth chip and a wireless fidelity (Wi-Fi) chip. In an embodiment, the semiconductor element 21 is either a Bluetooth chip or a Wi-Fi chip, and electronic elements 21' that do not generate electromagnetic interference can be also disposed on the top surface 20a of the substrate 20.

In an embodiment, the semiconductor element 21 is a wire bonding chip that is electrically connected with the electrical contact pads 200 on the top surface 20a of the substrate 20 via a plurality of corresponding bonding wires. In another embodiment, the semiconductor element 21 is a flip-chip that is electrically connected with the electrical contact pads 200 on the top surface 20a of the substrate 20 via a plurality of solder balls 210'.

In an embodiment, the shielding member 22 is a conductive board that is disposed on and electrically connected with the grounding part 201, so as to divide the top surface 20a of the substrate 20 into a plurality of placement rooms.

In an embodiment, the shielding member 22 can has an irregular or geometric shape. The semiconductor elements 21 are placed in the placement rooms, allowing the shielding member 22 to act as EMI shielding, so as to prevent electromagnetic interference between each of the semiconductor chips 21, for instance, to prevent electromagnetic interference between the blue tooth chip and the Wi-Fi chip.

As shown in FIG. 2B, an encapsulant 23 is formed and covers the top surface 20a of the substrate 20, so as to encapsulate the semiconductor elements 21, the electronic elements 21' and the shielding member 22.

In an embodiment, the encapsulant 23 has a top surface 23a and a bottom surface 23a opposing and coupled to the top surface 20a. The shielding member 22 is exposed from the top surface 23a of the encapsulant 23. In an embodiment, the shielding member 22 has a surface 22a exposed from the encapsulant 23 that is flush with a top surface 23a of the encapsulant 23.

In an embodiment, the semiconductor elements 21 and the electronic elements 21' are not exposed from the top surface 23a of the encapsulant 23.

As shown in FIG. 2C, through a chemical plating method such as a sputtering method, a metal layer 24 is formed on the side surface 20c of the substrate 20, the exposed surface 22a of the shielding member 22, and the top surface 23a and side surface 23c, so as to complete the manufacturing of the semiconductor package 2.

In an embodiment, the metal layer 24 is electrically connected with the shielding member 22, allowing the metal layer 24 to act as a electromagnetic shielding to prevent electromagnetic interference, for instance to prevent signal interference between the blue tooth chip and Wi-Fi chip.

In an embodiment, the metal layer 24 is formed through coating and reflow methods.

In an embodiment, the metal layer 24 is made of copper (Cu), nickel (Ni), iron (Fe), aluminum (Al) or stainless steel (Sus).

In another embodiments, as shown in FIG. 2C' the metal layer 24 is used to electrically connect the shielding member 22 with the inner circuit 202 of the substrate 20 (as the inner circuit is exposed from the side surface 20c of the substrate 20).

Accordingly, in the method of manufacturing the semiconductor package according to the present invention, the problem of electromagnetic interference caused between at least two of the semiconductor elements 21 can be prevented through the shielding member 22 dividing the space of the semiconductor elements 21.

The present invention further provides a semiconductor package 2, and 2', comprising: a substrate 20, a plurality of semiconductor elements 21, at least one shielding member 22, and an encapsulant 23.

The semiconductor package 2 is a radio frequency module.

The substrate 20 has an inner circuit 202, a plurality of electrical contact pads 200, and at least one grounding part 201.

The semiconductor element 21 is disposed on the substrate 20 and electrically connected with the electrical contact pads 200. In an embodiment, the semiconductor element 21 is a radio frequency chip, such as a Bluetooth chip and Wi-Fi chip.

The shielding member 22 is disposed on the substrate 20 and between at least two of the semiconductor elements 21, and is electrically connected with the grounding part 201.

The encapsulant 23 is formed on the substrate 20 and encapsulates the semiconductor elements 21 and the shielding member 22. In an embodiment, the shielding member 22 is exposed from the encapsulant 23.

In an embodiment, the semiconductor element 2 further comprises a metal layer 24 formed on the encapsulant 23 and electrically connected with the shielding member 22. The metal layer is made of copper, nickel, iron, aluminum, or stainless steel. In an embodiment, the metal layer 24 can be selectively connected electrically to the inner circuit 202.

In summary, the semiconductor package and the method of manufacturing the same provide a shielding member to prevent electromagnetic interference happened among each of the semiconductor element.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
    a substrate;
    a plurality of semiconductor elements disposed on the substrate;
    a shielding member disposed on the substrate between at least two of the semiconductor elements; and
    an encapsulant formed on the substrate and encapsulating the semiconductor elements and the shielding member, wherein the shielding member has two opposite surfaces exposed from the encapsulant, the two opposite surfaces being respectively flush with a top surface and a bottom surface of the encapsulant.

2. The semiconductor package of claim 1, wherein at least one of the semiconductor elements is a radio frequency chip.

3. The semiconductor package of claim 2, wherein the radio frequency chip is a Bluetooth chip or a Wi-Fi chip.

4. The semiconductor package of claim 1, wherein the shielding member is a board.

5. The semiconductor package of claim 1, further comprising a metal layer formed on the encapsulant.

6. The semiconductor package of claim 5, wherein the metal layer is electrically connected with the shielding member.

7. The semiconductor package of claim 5, wherein the substrate includes a circuit that is electrically connected with the metal layer.

8. The semiconductor package of claim 5, wherein the metal layer is made of copper, nickel, iron, aluminum, or stainless steel.

9. A method of manufacturing a semiconductor package, comprising:
- disposing on a substrate a plurality of semiconductor elements and a shielding member, in a manner that the shielding member is positioned between at least two of the semiconductor elements; and
- forming an encapsulant on the substrate to encapsulate the semiconductor elements and the shielding member, wherein the shielding member has two opposite surfaces exposed from the encapsulant, the two opposite surfaces being respectively flush with a top surface and a bottom surface of the encapsulant.

10. The method of claim 9, wherein at least one of the semiconductor elements is a radio frequency chip.

11. The method of claim 10, wherein the radio frequency chip is a Bluetooth chip or a Wi-Fi chip.

12. The method of claim 9, wherein the shielding member is a board.

13. The method of claim 9, further comprising forming a metal layer on the encapsulant.

14. The method of claim 13, wherein the metal layer is electrically connected with the shielding member.

15. The method of claim 13, wherein the substrate includes a circuit that is electrically connected with the metal layer.

16. The method of claim 13, wherein the metal layer is made of copper, nickel, iron, aluminum, and stainless steel.

* * * * *